(12) United States Patent
Chang et al.

(10) Patent No.: US 7,768,353 B2
(45) Date of Patent: Aug. 3, 2010

(54) SYSTEMS AND METHODS FOR SWITCHING MODE POWER AMPLIFIER CONTROL

(75) Inventors: Jaejoon Chang, Duluth, GA (US); Ki Seok Yang, Atlanta, GA (US); Kyu Hwan An, Dunwoody, GA (US); Wangmyong Woo, Suwanee, GA (US); Chang-Ho Lee, Marietta, GA (US); Younsuk Kim, Yong-in (KR); Hyogun Bae, Seoul (KR); Kijoong Kim, Hwasung (KR); Shinichi Iizuka, Gyunggi-do (KR)

(73) Assignee: Samsung Electro-Mechanics Company, Ltd. (KR)

( * ) Notice: Subject to any disclaimer, the term of this patent is extended or adjusted under 35 U.S.C. 154(b) by 96 days.

(21) Appl. No.: 12/138,965

(22) Filed: Jun. 13, 2008

(65) Prior Publication Data

US 2009/0309661 A1    Dec. 17, 2009

(51) Int. Cl.
*H03G 3/10* (2006.01)
(52) U.S. Cl. ...................................... 330/285; 330/133
(58) Field of Classification Search ................. 330/285, 330/296, 133
See application file for complete search history.

(56) References Cited

U.S. PATENT DOCUMENTS

| | | |
|---|---|---|
| 4,754,231 A | 6/1988 | Sawa |
| 4,815,113 A | 3/1989 | Ludwig et al. |
| 4,901,032 A | 2/1990 | Komiak |
| 4,933,626 A | 6/1990 | Halbach et al. |
| 4,985,686 A | 1/1991 | Davidson et al. |
| 5,101,175 A | 3/1992 | Vaisanen |
| 5,119,042 A | 6/1992 | Crampton et al. |
| 5,164,679 A | 11/1992 | Dittmer |
| 5,193,224 A | 3/1993 | McNicol et al. |
| 5,196,806 A | 3/1993 | Ichihara |
| 5,363,057 A | 11/1994 | Furuno |
| 5,378,996 A | 1/1995 | Pai et al. |
| 5,406,225 A | 4/1995 | Iida et al. |
| 5,416,441 A | 5/1995 | Nagano |
| 5,423,081 A | 6/1995 | Thiele et al. |
| 5,428,316 A | 6/1995 | Molnar |
| 5,430,416 A | 7/1995 | Black et al. |
| 5,442,322 A | 8/1995 | Kornfeld et al. |
| 5,485,120 A | 1/1996 | Anvari |
| 5,493,255 A | 2/1996 | Murtojarvi |
| 5,497,125 A | 3/1996 | Royds |
| 5,511,239 A | 4/1996 | Dennerlein et al. |
| 5,568,088 A | 10/1996 | Dent et al. |
| 5,574,967 A | 11/1996 | Dent et al. |

(Continued)

*Primary Examiner*—Henry K Choe
(74) *Attorney, Agent, or Firm*—Sutherland Asbill & Brennan LLP

(57) ABSTRACT

Embodiments of the invention may provide for enhancement systems and methods for a power amplifier output control system. In an example embodiment, driver amplifier control may be provided in conjunction with power amplifier control to improve the power efficiency and/or dynamic range of the transmitter system. Furthermore, control over the driver amplifier may allow for relaxed power control slope, which may lessens the burden of digital to analog converters (DACs) in transmitter systems such as cellular transmitter systems. Also, systems and methods in accordance with example embodiments of the invention may provide a less sensitive solution to operational environment variations such as temperature, battery power voltage and implementation IC process.

24 Claims, 11 Drawing Sheets

U.S. PATENT DOCUMENTS

| | | |
|---|---|---|
| 5,585,762 A | 12/1996 | Dekker |
| 5,598,126 A | 1/1997 | Dekker |
| 5,638,024 A | 6/1997 | Dent et al. |
| 5,656,972 A | 8/1997 | Norimatsu |
| 5,684,430 A | 11/1997 | Yamamoto |
| 5,724,005 A | 3/1998 | Chen et al. |
| 5,732,325 A | 3/1998 | Dent et al. |
| 5,742,206 A | 4/1998 | Ishida |
| 5,770,971 A | 6/1998 | McNicol |
| 5,771,444 A | 6/1998 | Dent et al. |
| 5,771,470 A | 6/1998 | Nimmo et al. |
| 5,784,689 A | 7/1998 | Kobayashi |
| 5,842,140 A | 11/1998 | Dent et al. |
| 5,854,571 A | 12/1998 | Pinckley et al. |
| 5,854,971 A | 12/1998 | Nagoya et al. |
| 5,892,396 A | 4/1999 | Anderson et al. |
| 5,903,192 A | 5/1999 | Ludwig et al. |
| 5,912,588 A | 6/1999 | Nummila |
| 5,914,641 A | 6/1999 | Yun et al. |
| 5,942,946 A | 8/1999 | Su et al. |
| 5,966,051 A | 10/1999 | Griffith et al. |
| 5,994,964 A | 11/1999 | Tanemura |
| 6,043,706 A | 3/2000 | Nowak et al. |
| 6,046,649 A | 4/2000 | Lange |
| 6,072,995 A | 6/2000 | Boesch et al. |
| 6,097,251 A | 8/2000 | Khullar et al. |
| 6,107,872 A | 8/2000 | Schoepe et al. |
| 6,118,337 A | 9/2000 | Schweighofer |
| 6,122,492 A | 9/2000 | Sears |
| 6,154,664 A | 11/2000 | Chorey et al. |
| 6,160,449 A | 12/2000 | Klomsdorf et al. |
| 6,166,591 A | 12/2000 | Schmultz et al. |
| 6,166,598 A | 12/2000 | Schueter |
| 6,169,455 B1 | 1/2001 | Yamaguchi |
| 6,169,885 B1 | 1/2001 | Walukas et al. |
| 6,169,886 B1 | 1/2001 | Black et al. |
| 6,178,313 B1 | 1/2001 | Mages et al. |
| 6,194,968 B1 | 2/2001 | Winslow |
| 6,201,440 B1 | 3/2001 | Kobayashi |
| 6,216,012 B1 | 4/2001 | Jensen |
| 6,236,267 B1 | 5/2001 | Anzil |
| 6,252,456 B1 | 6/2001 | Baker et al. |
| 6,252,463 B1 | 6/2001 | Kobayashi |
| 6,255,910 B1 | 7/2001 | Forstner |
| 6,268,772 B1 | 7/2001 | Chen |
| 6,275,106 B1 | 8/2001 | Gomez |
| 6,307,429 B1 | 10/2001 | Olgaard |
| 6,329,875 B1 | 12/2001 | Ishida et al. |
| 6,359,508 B1 | 3/2002 | Mucenieks |
| 6,417,736 B1 | 7/2002 | Lewyn |
| 6,445,247 B1 | 9/2002 | Walker |
| 6,463,267 B1 | 10/2002 | Akamine et al. |
| 6,486,738 B2 | 11/2002 | Park |
| 6,515,545 B1 | 2/2003 | Hu et al. |
| 6,518,840 B1 | 2/2003 | Rahn et al. |
| 6,522,202 B2 | 2/2003 | Brandt |
| 6,594,474 B1 | 7/2003 | Grasset et al. |
| 6,614,309 B1 | 9/2003 | Pehlke |
| 6,617,928 B2 | 9/2003 | Finlay et al. |
| 6,624,702 B1 | 9/2003 | Dening |
| 6,639,471 B2 | 10/2003 | Matsuura et al. |
| 6,646,510 B2 | 11/2003 | Julien et al. |
| 6,657,499 B2 | 12/2003 | Lin |
| 6,658,243 B2 | 12/2003 | Akamine et al. |
| 6,683,496 B2 * | 1/2004 | Poggi et al. ................. 330/132 |
| 6,693,488 B1 | 2/2004 | van Rhijn |
| 6,703,897 B2 | 3/2004 | O'Flaherty et al. |
| 6,744,321 B2 | 6/2004 | Noh et al. |
| 6,747,516 B2 | 6/2004 | Zhang et al. |
| 6,750,722 B2 | 6/2004 | Newman et al. |
| 6,759,906 B2 * | 7/2004 | Matsunaga et al. .......... 330/285 |
| 6,765,443 B2 | 7/2004 | Pehlke |
| 6,798,287 B2 | 9/2004 | Wu et al. |
| 6,803,822 B2 | 10/2004 | Kim et al. |
| 6,819,180 B2 | 11/2004 | Krvavac |
| 6,838,932 B2 | 1/2005 | Izumiyama et al. |
| 6,894,561 B2 | 5/2005 | Apel |
| 6,900,697 B1 | 5/2005 | Doyle et al. |
| 6,903,608 B2 | 6/2005 | Whittaker et al. |
| 6,917,244 B2 | 7/2005 | Rosnell et al. |
| 6,960,956 B2 | 11/2005 | Pehlke et al. |
| 6,992,524 B2 | 1/2006 | Yang et al. |
| 6,995,616 B2 | 2/2006 | Behzad et al. |
| 6,996,191 B1 | 2/2006 | Meditz |
| 6,998,919 B2 | 2/2006 | Gamero et al. |
| 7,023,278 B1 | 4/2006 | Vagher et al. |
| 7,046,083 B2 | 5/2006 | Apel |
| 7,046,087 B1 | 5/2006 | Naik et al. |
| 7,064,614 B2 | 6/2006 | Feng et al. |
| 7,076,218 B2 | 7/2006 | Greverie et al. |
| 7,102,464 B1 | 9/2006 | Apel |
| 7,136,003 B1 | 11/2006 | Ripley et al. |
| 7,138,863 B2 | 11/2006 | Persson |
| 7,148,747 B2 | 12/2006 | Lee |
| 7,184,722 B1 | 2/2007 | Johnson et al. |
| 7,193,460 B1 | 3/2007 | Naik et al. |
| 7,193,470 B2 | 3/2007 | Lee et al. |
| 7,193,471 B2 * | 3/2007 | Tsutsui et al. ............... 330/285 |
| 7,196,582 B2 | 3/2007 | Darabi et al. |
| 7,196,583 B2 | 3/2007 | Clifton et al. |
| 7,248,111 B1 | 7/2007 | Xu et al. |
| 7,265,627 B2 | 9/2007 | Joly |
| 7,271,656 B2 | 9/2007 | Joly et al. |
| 7,276,973 B2 | 10/2007 | Ripley et al. |
| 7,279,979 B2 | 10/2007 | Autti |
| 7,288,991 B2 | 10/2007 | Ripley |
| 7,301,459 B2 | 11/2007 | Frederick et al. |
| 7,307,478 B2 | 12/2007 | Anand |
| 7,310,015 B2 | 12/2007 | Jeon et al. |
| 7,312,655 B2 | 12/2007 | Kim |
| 7,345,537 B2 * | 3/2008 | Apel et al. .................. 330/134 |
| 7,365,599 B2 | 4/2008 | Filimonov et al. |
| 7,378,909 B2 | 5/2008 | Tomizawa |
| 7,382,193 B2 | 6/2008 | Osman et al. |

* cited by examiner

SYSTEMS AND METHODS FOR SWITCHING MODE POWER AMPLIFIER CONTROL

FIELD OF THE INVENTION

Embodiments of the invention relate generally to power amplifier system control, and more specifically to control of a driver amplifier and a power amplifier.

BACKGROUND OF THE INVENTION

With an advance of recent wide variety of mobile communication standards, the technical demand for more accurate and more efficient control of output power from the mobile transmitter system has emerged. The control of output power is required from various reasons such as a) to prevent one cell from interfering with the reception of other neighboring cells, b) minimizing output to reduce the power consumption from the limited source of energy while keeping the communication capability.

BRIEF SUMMARY OF THE INVENTION

According to an example embodiment of the invention, there may be a power-amplifier system. The power-amplifier system may include a driver amplifier that may be operative to receive an input signal and generate an amplified input signal, and a circuit for receiving a power control signal and generating a first control bias signal for adjusting an operation of the driver amplifier. The power-amplifier system may further include a power amplifier that is operative to receive the amplified input signal and generate an output signal, and a feedback loop that receives the power control signal and generates a second control bias signal for adjusting an operation of the power amplifier. the feedback loop may include a sensing block that detects a parameter associated with the output signal of the power amplifier, and a comparator that compares the detected parameter or a variation of the detected parameter to the received power control signal, wherein based upon the comparison, the comparator generates a compensation signal associated with the second control bias signal According to another example embodiment of the invention, there may be another power-amplifier system. The power amplifier system may include a driver amplifier that amplifies a radio frequency (RF) input to generate an amplified input signal, where a first control of the driver amplifier is responsive to a power control signal in delivering a first bias signal to the driver amplifier, and a power amplifier that amplifies the amplified input signal to generate a RF output, where a second control of the power amplifier is responsive to the power control signal and a detected parameter associated with the RF output in delivering a second bias signal to the power amplifier.

BRIEF DESCRIPTION OF THE DRAWINGS

Figure 1A:
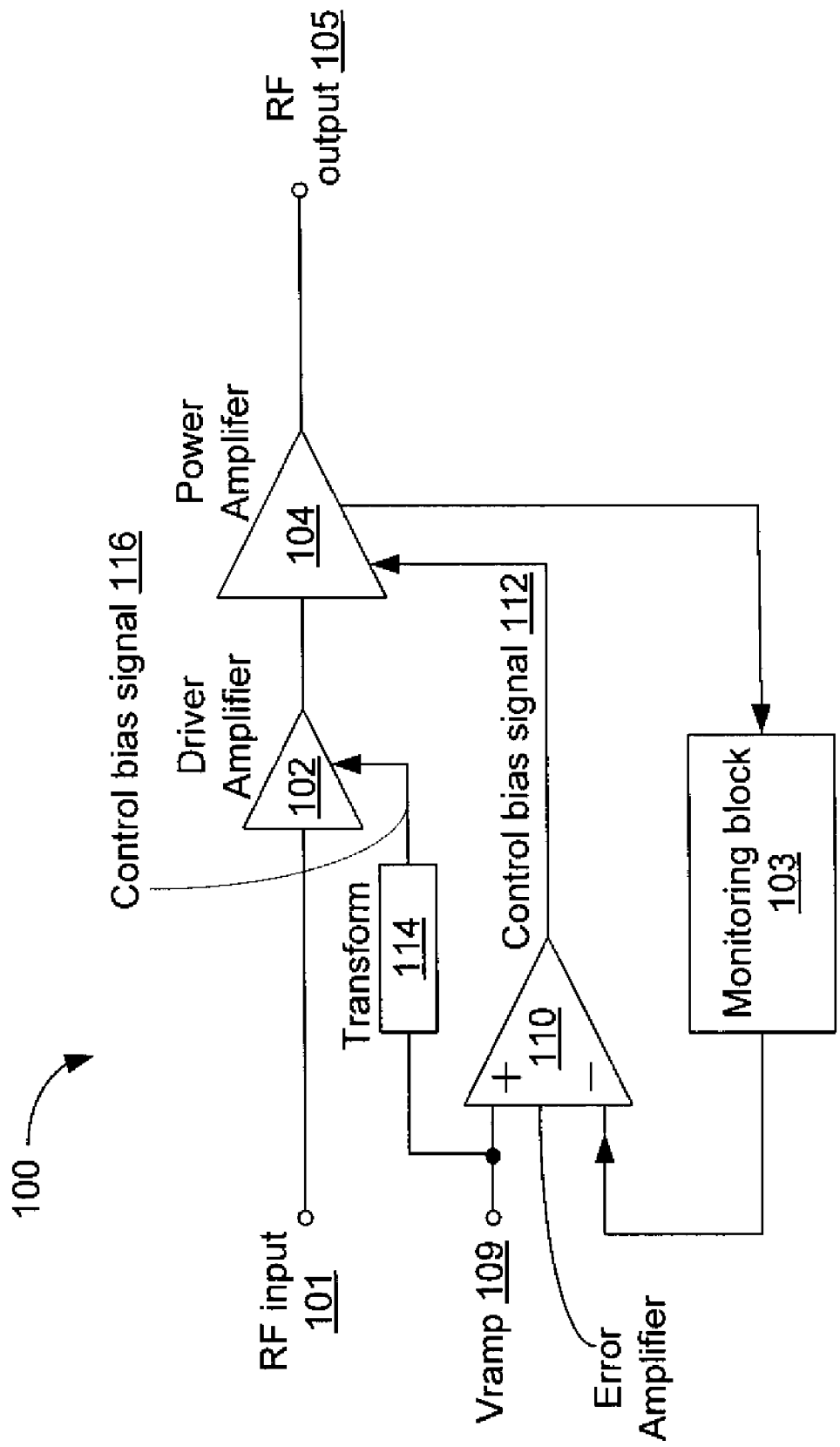
Figure 1B:
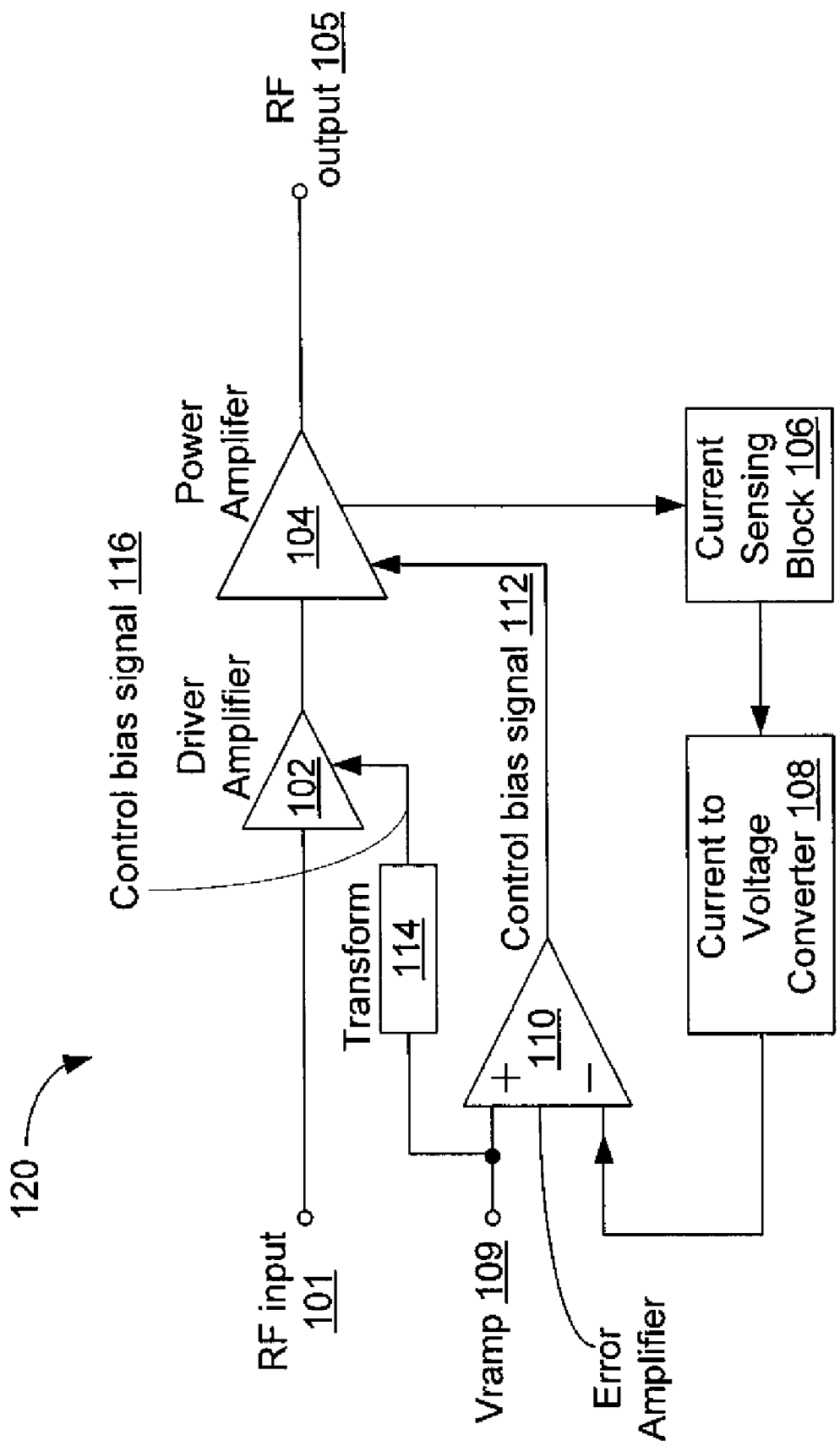
Figure 1C:
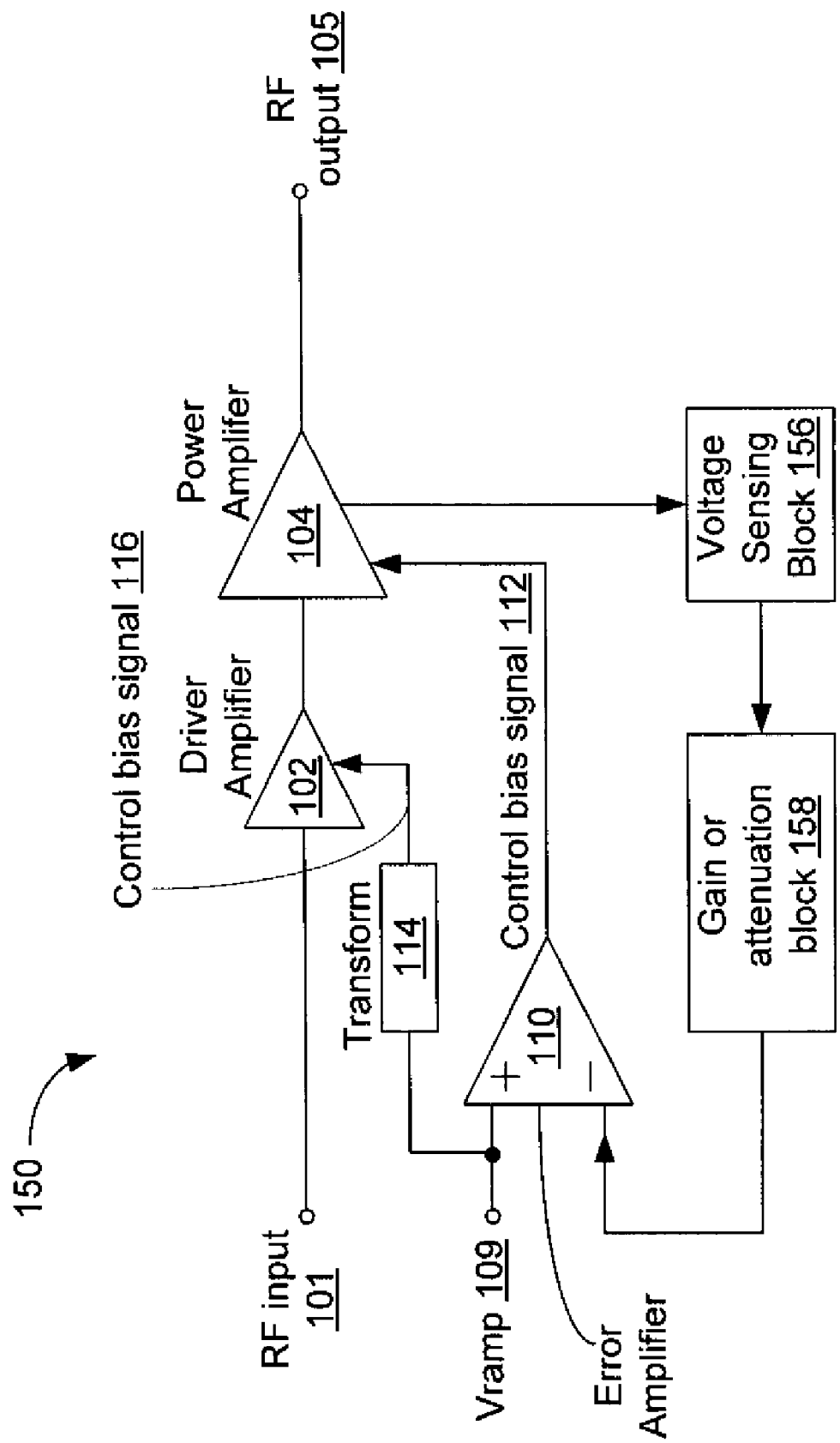
Figure 2A:
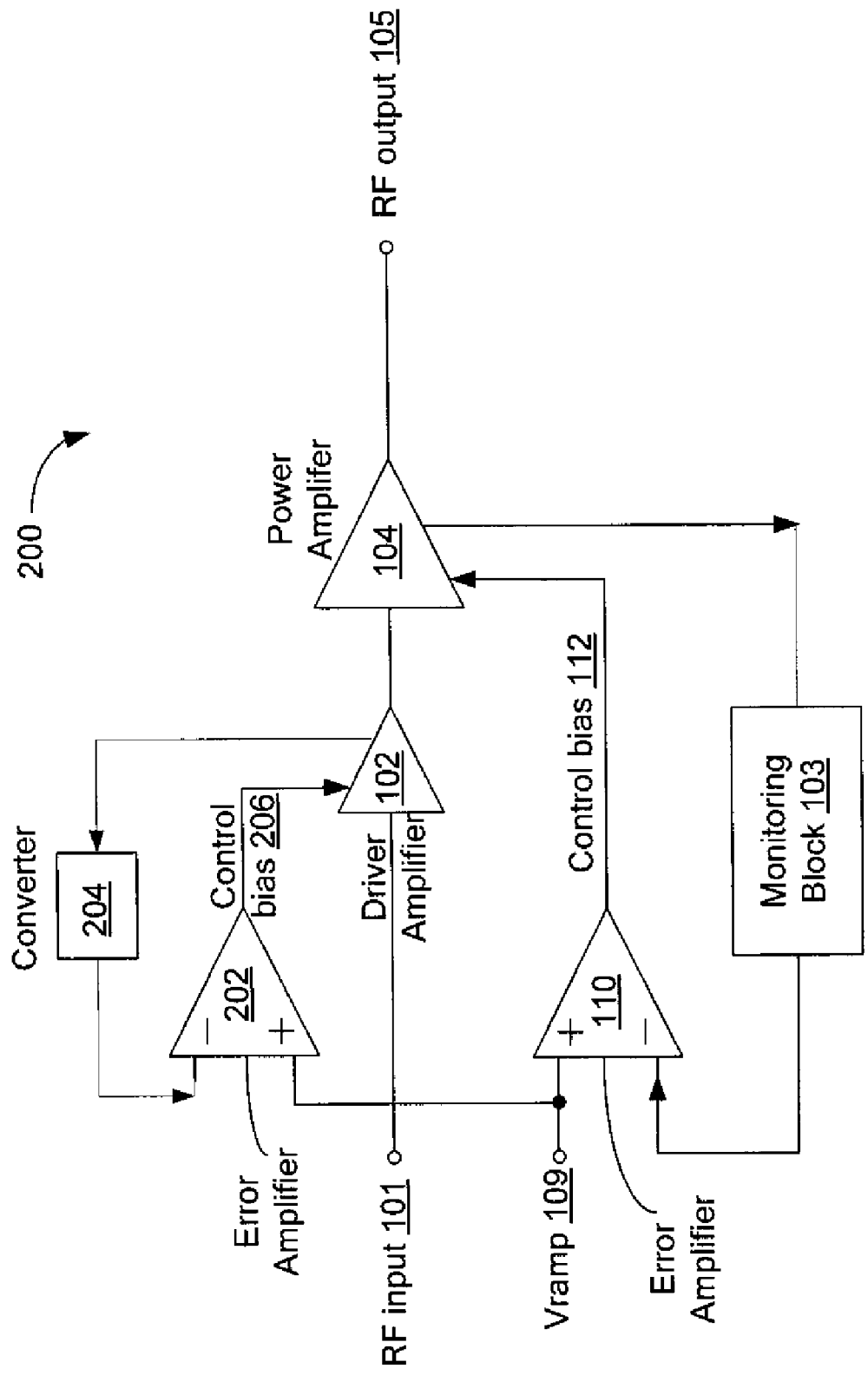
Figure 2B:
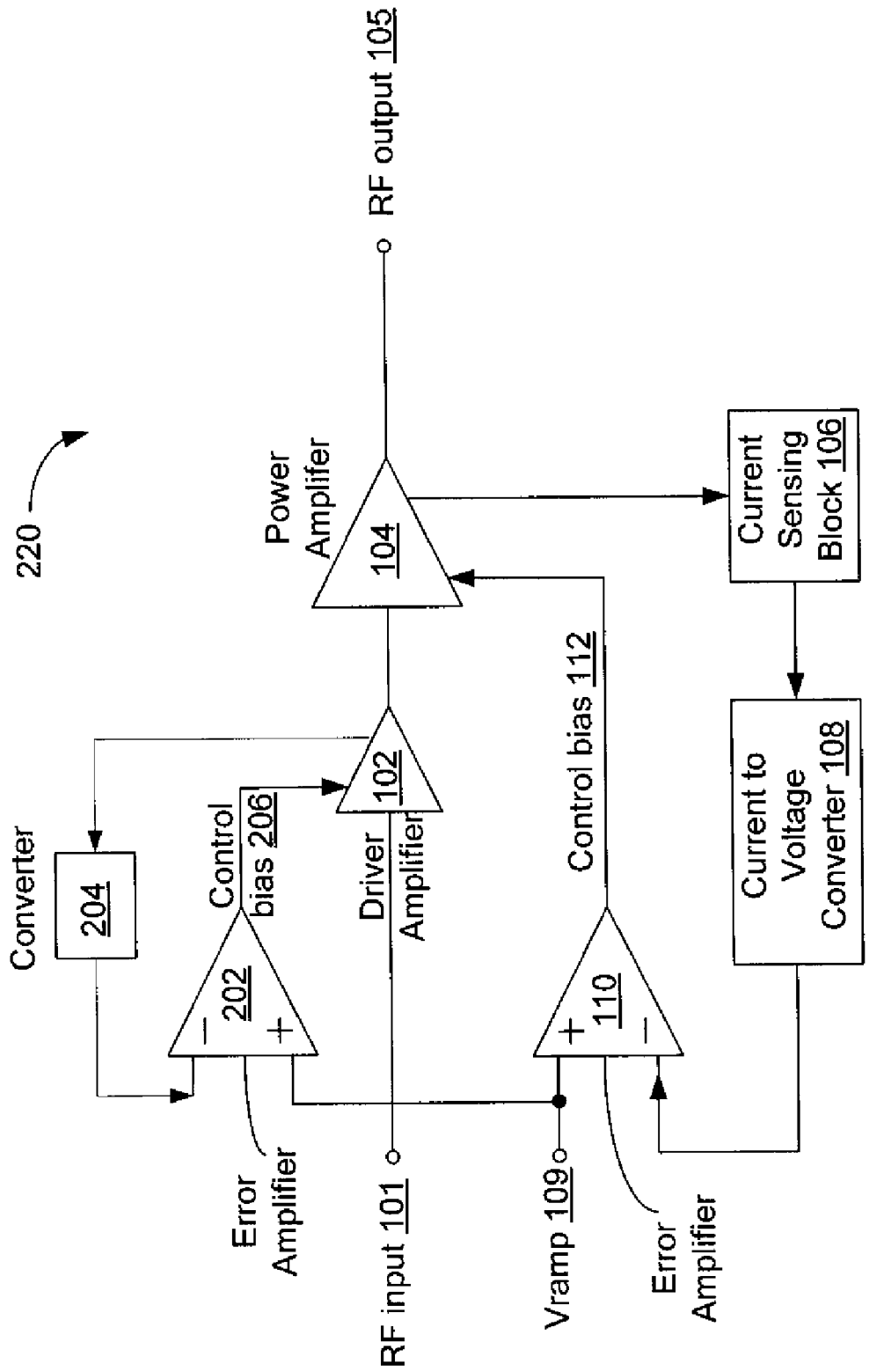
Figure 2C:
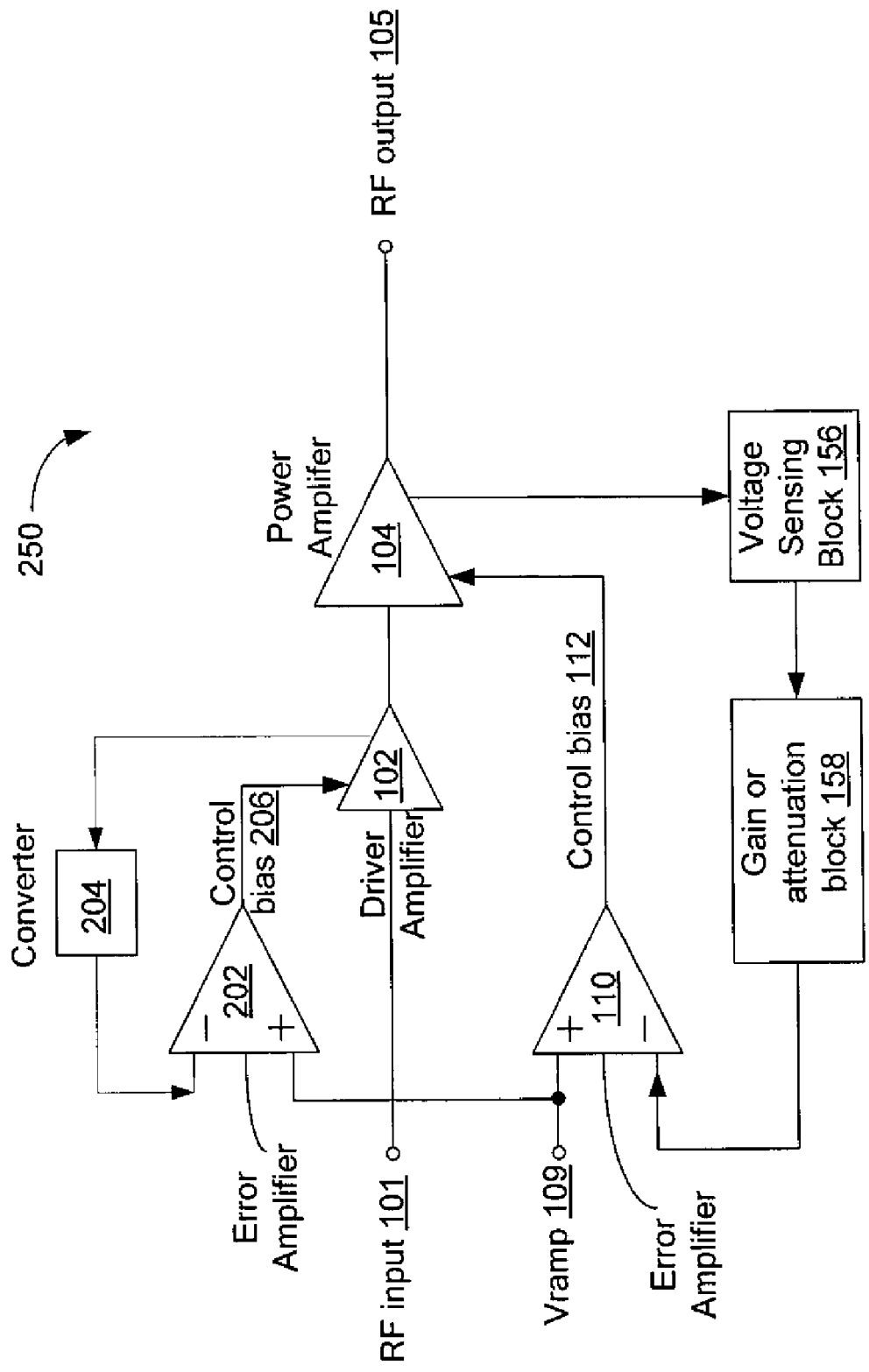

Having thus described the invention in general terms, reference will now be made to the accompanying drawings, which are not necessarily drawn to scale, and wherein:

FIGS. 1A-1C illustrate example power amplifier control systems using open-loop controls for driver amplifiers, according to an example embodiment of the invention, FIGS. 2A-2C illustrate example power amplifier control systems using closed-loop controls for driver amplifiers, according to an example embodiment of the invention.

Figure 3A:
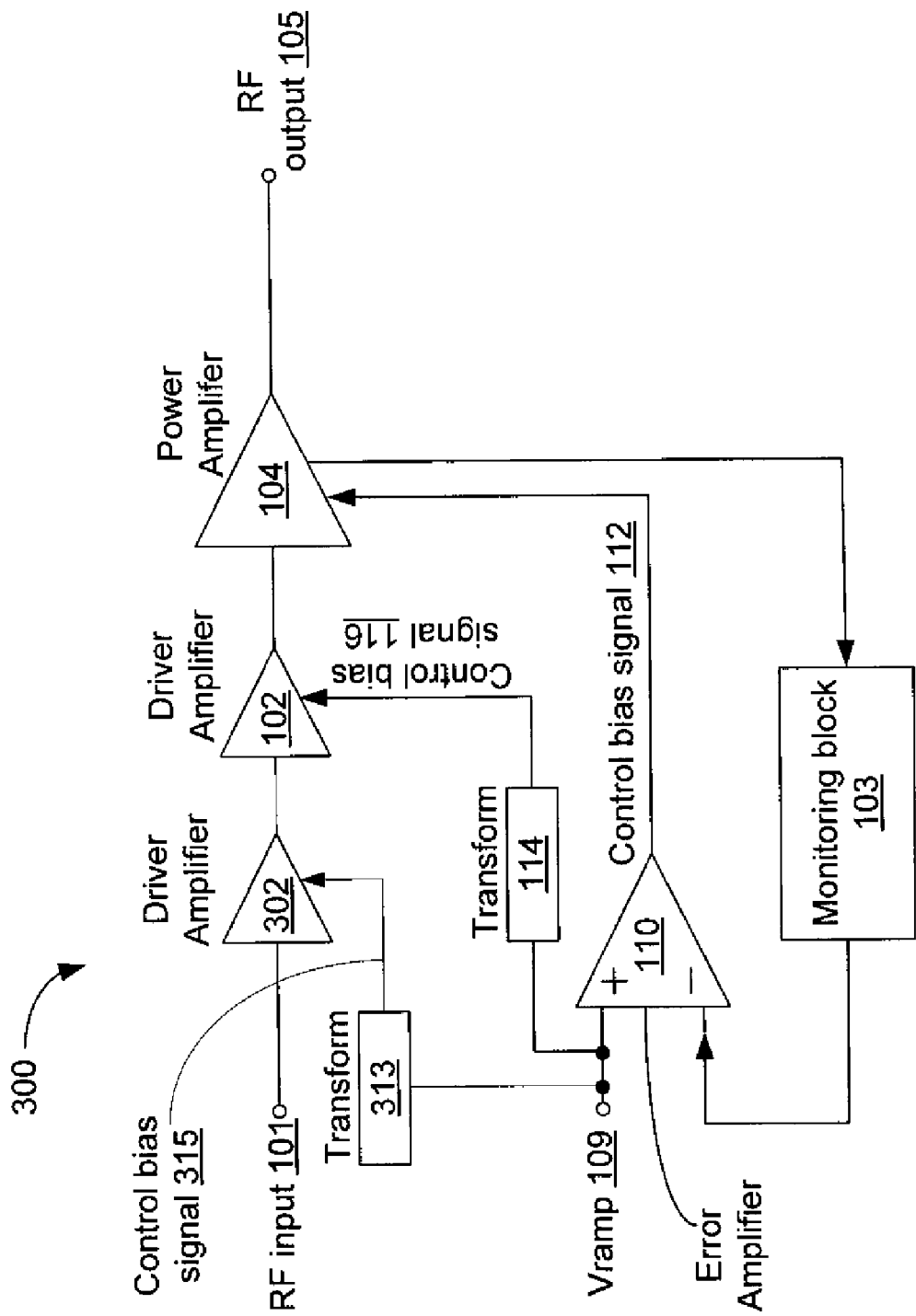
Figure 3B:
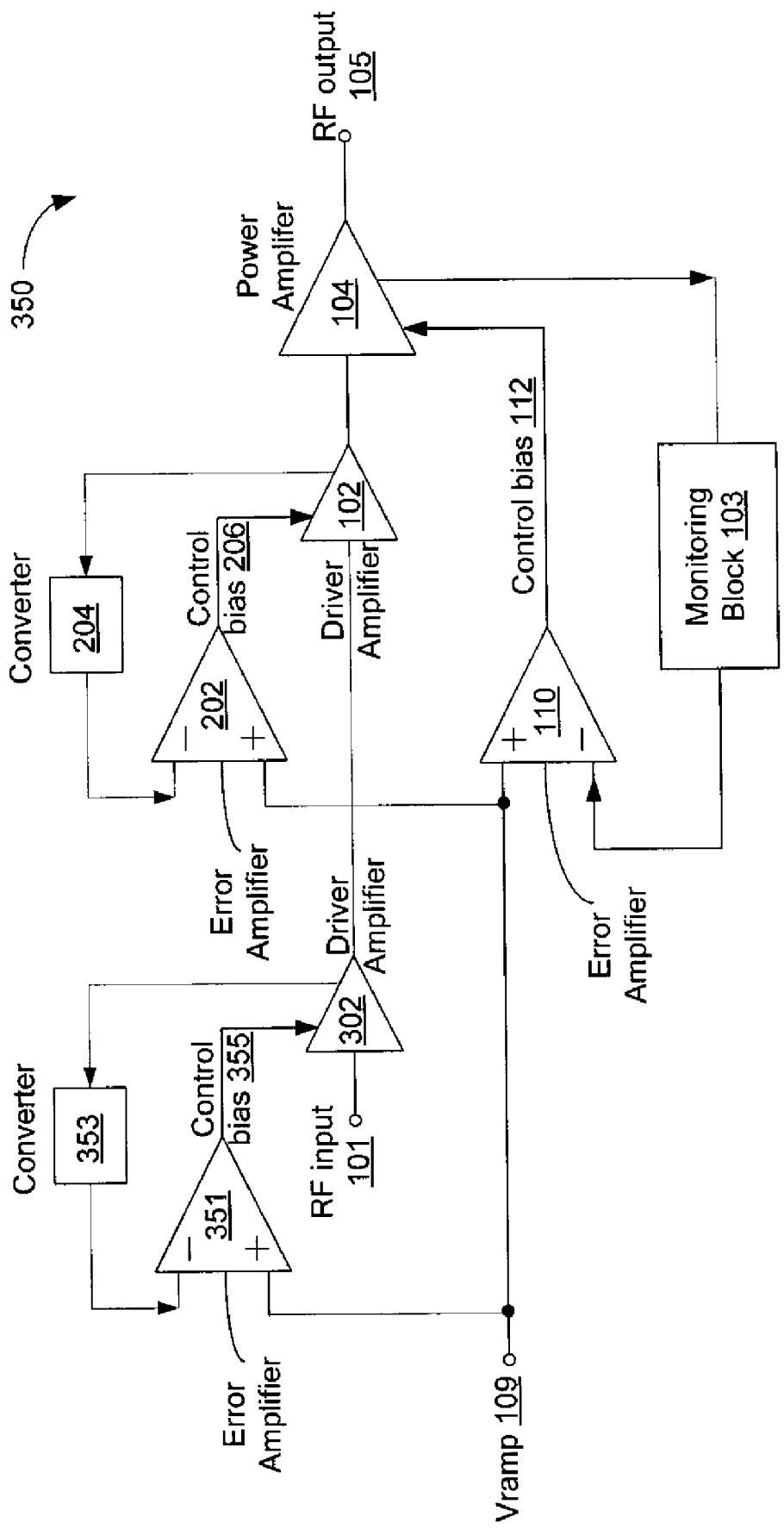

FIGS. 3A-3B illustrate example power amplifier systems having control over multiple driver amplifiers, according to an example embodiment of the invention.

Figure 4:
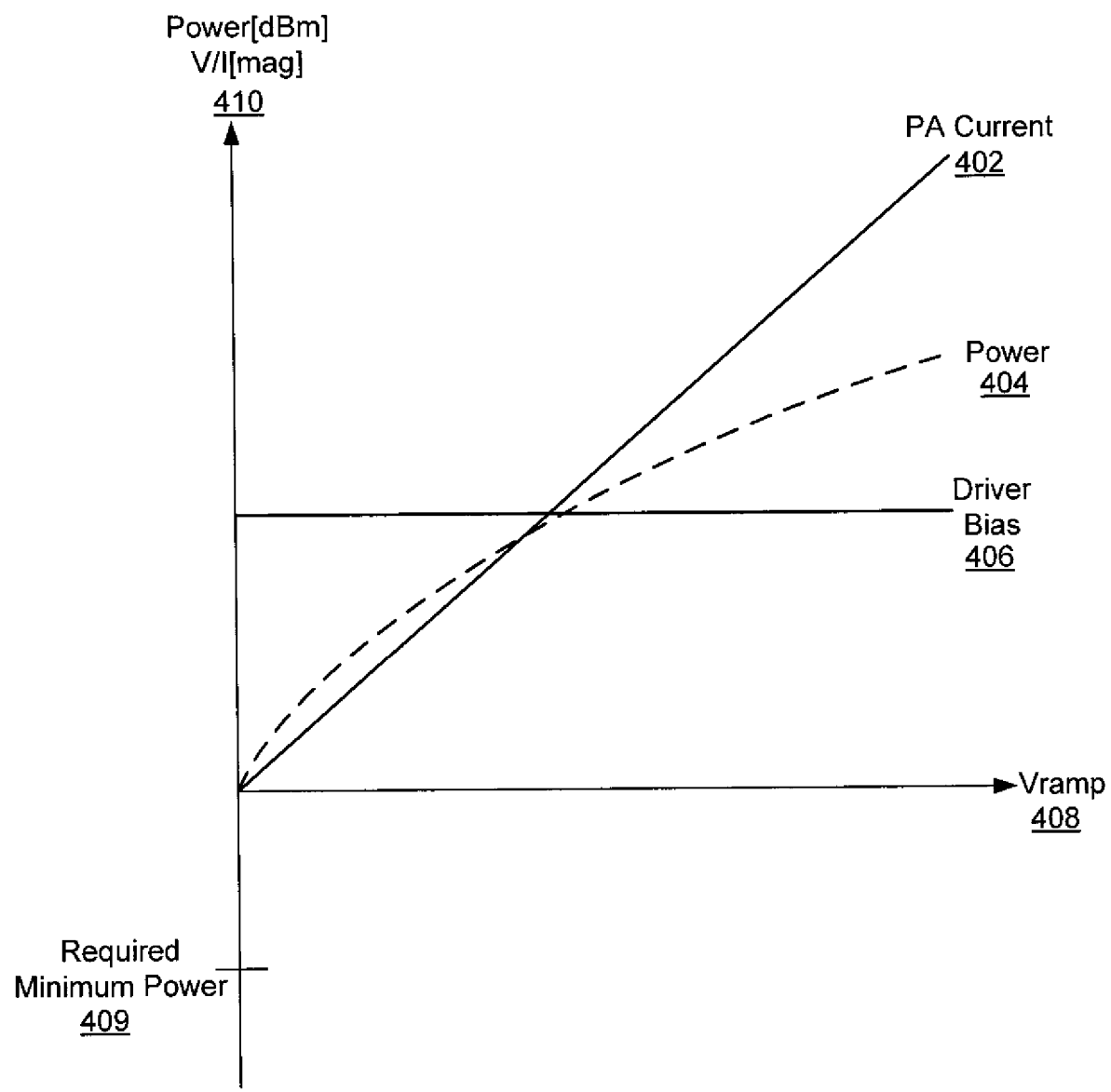

FIG. 4 illustrates an example graph of an operation of a power amplifier system that utilizes current-sensing, closed-loop control over the power amplifier, but with constant operation of the driver amplifier.

Figure 5:
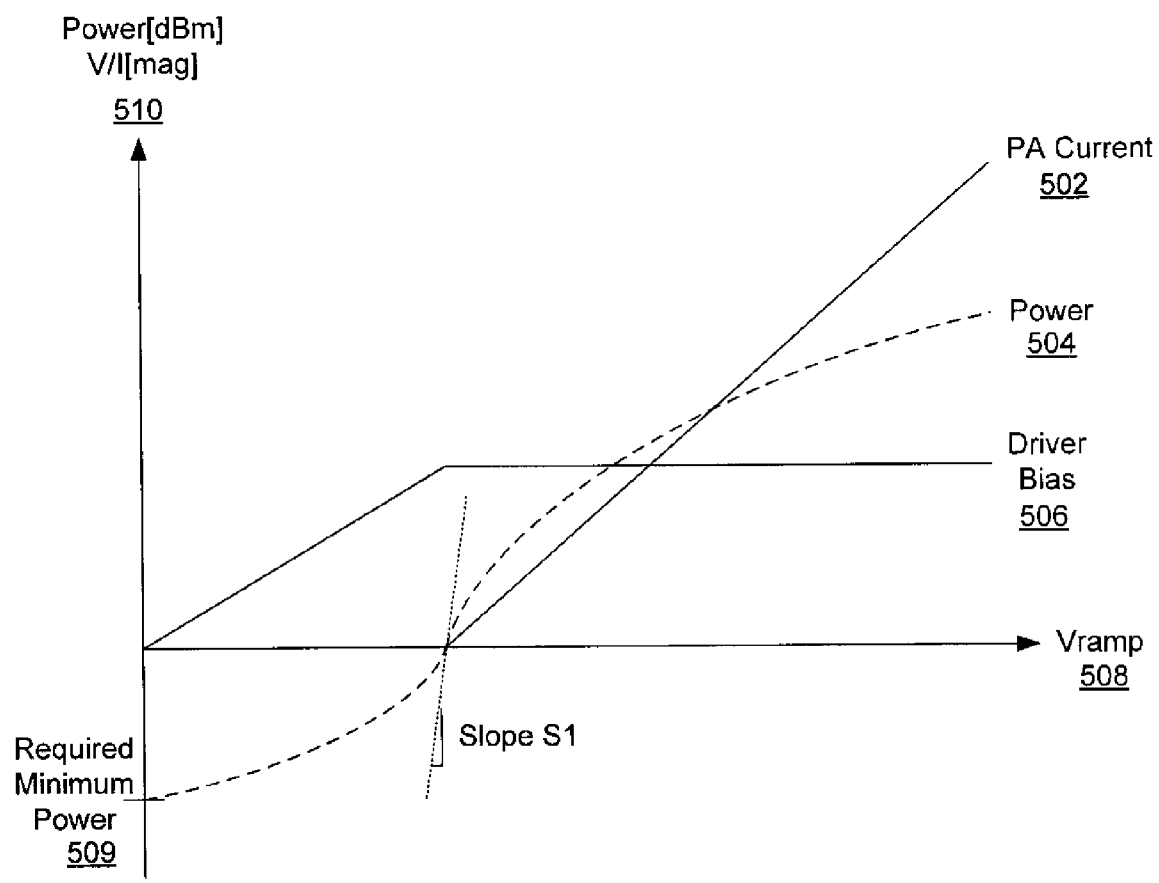

FIG. 5 illustrates an example graph of an operation of a power amplifier system that utilizes control over both the power amplifier and driver amplifier, according to an example embodiment of the invention.

Figure 6:
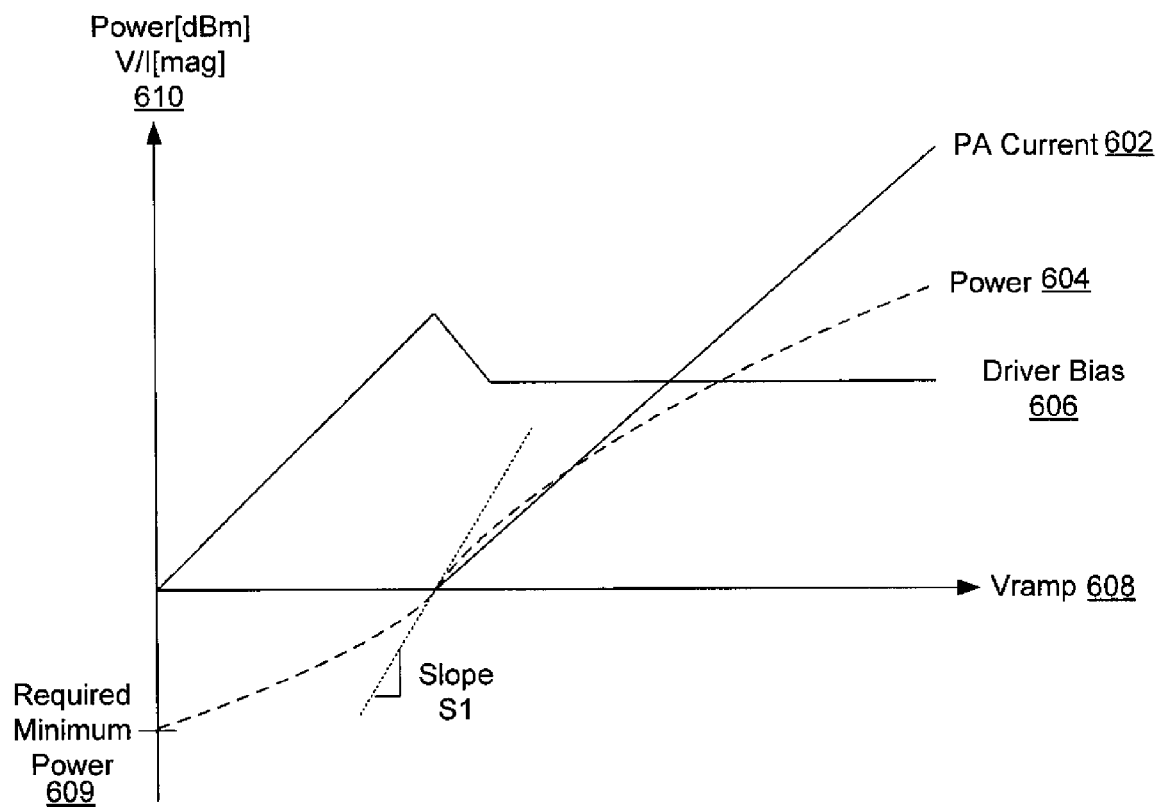

FIG. 6 illustrates another example graph of an operation of a power amplifier system that utilizes control over both the power amplifier and driver amplifier, according to an example embodiment of the invention.

DETAILED DESCRIPTION OF THE INVENTION

Example embodiments of the invention now will be described more fully hereinafter with reference to the accompanying drawings, in which some, but not all embodiments of the invention are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

Example embodiments of the invention may provide for control over a power amplifier system to provide one or more of: (i) efficiency enhancement, (ii) dynamic range increase, (iii) enhanced power control slope, and (iv) immunity to operational environment, such as battery voltage and/or temperature. As an example, bias adjustment of the driver amplifier may be provided in conjunction with power amplifier current control to enhance the efficiency and/or increase the dynamic range of the power amplifier Likewise, bias adjustment of the driver amplifier may allow for relaxed power control slope, which may lessen the burden of digital to analog converters (DACs) in transmitter systems such as cellular transmitter systems. Also, systems and methods in accordance with example embodiments of the invention may provide a less sensitive solution to operational environment variations such as temperature, battery power voltage and implementation IC process.

FIGS. 1A, 1B, and 1C illustrate example power amplifier control systems, according to an example embodiment of the invention. As shown by FIG. 1A, the system 100 may include a driver amplifier 102 and a power amplifier 104. The driver amplifier 102 may be operative to receive a radio frequency (RF) input 101 and generate an amplified input signal. The power amplifier 104 may be operative to receive the amplified input signal from the driver amplifier 102, which may be further amplified to generate an RF output 105. The RF output 105 may be directed towards an antenna, according to an example embodiment of the invention. In an example embodiment of the invention, the power amplifier 104 may be configured for switching operation, and accordingly, the amplified input signal from the driver amplifier 102 may be relatively large to support the operation of the power amplifier 104.

According to an example embodiment of the invention, an operation of the power amplifier 104 may be controlled by a closed loop, which may also be referred to as a feedback loop, according to an example embodiment of the invention. The feedback loop may comprise a monitoring block 103 and a comparator or error amplifier 110, according to an example embodiment of the invention. The monitoring block 103 may be operative to detect a parameter associated with the RF output 105. In an example embodiment of the invention, the detected parameter may be a power, current, or voltage associated with the RF output 105 of the power amplifier 104. The detected parameter, or a variation thereof, from the monitoring block 103 may then be provided to the comparator or error amplifier 110.

According to an example embodiment of the invention, the monitoring block 103 may be implemented in a variety of ways, as exemplified by FIGS. 1B and 1C. As shown by the system 120 of FIG. 1B, the monitoring block 103 of FIG. 1A may comprise a current sensing block 106 and a current-to-voltage converter 108, according to an example embodiment of the invention. The current sensing block 106 may be operative to detect a current associated with the RF output 105. In an example embodiment of the invention, the current sensing block 106 may comprise a resistor for detecting the output current provided at the RF output 105. The current sensing block 106 may provide the detected output current to a current-to-voltage converter 108. The current-to-voltage converter 108 may be operative to convert the detected current to a voltage. The output voltage from the current-to-voltage converter 108 may be provided as an input to the comparator or error amplifier 110.

According to one alternative embodiment shown by system 150 of FIG. 1C, the monitoring block 103 of FIG. 1A may comprise a voltage sensing block 156 and a gain or attenuation block 158. The voltage sensing block 156 may provide the detected voltage to a gain or attenuation block 158. The gain or attenuation block 158 may be operative to scale the detected voltage as required or desired. The output of the voltage from the gain or attenuation block 158 may then be provided as input to the comparator or error amplifier 110.

Referring to FIGS. 1A, 1B, and 1C, the comparator or error amplifier 110 may additionally receive a power control signal 109, which may be referred to as Vramp or Vapc, according to an example embodiment of the invention. The comparator or error amplifier 110 may be operative to determine an extent to which the output voltage from the converter 108 differs from the power control signal (Vramp) 109. According to an example embodiment of the invention, the comparator or error amplifier 110 may determine a difference between the output voltage from the converter 108 and the power control signal (Vramp) 109. Based upon the difference, the comparator or error amplifier 110 may generate a compensation signal. In an example embodiment of the invention, the compensation signal may be an actual control bias signal 112 that may be provided to the power amplifier 104 for operating or controlling an operation of the power amplifier 104. However, it will be appreciated that the feedback loop may also include a transform circuit for converting the compensation signal into the control bias signal 112, according to an example embodiment of the invention. The control bias signal 112 may be in the form of either a current control bias signal or a voltage control bias signal, according to an example embodiment of the invention.

As described herein, the control bias signal 112 may be provided to the power amplifier 104 for controlling an operation of the power amplifier 104. The power amplifier 104 may increase, decrease, or maintain its level of output in response to the control bias signal 112, according to an example embodiment of the invention. For example, if the control bias 112 indicates that the RF output 105 is too low, perhaps where the output voltage from the converter 108 is lower than the power control signal (Vramp) 109, the power amplifier 104 may respond to the control bias signal 112 by increasing its level of output. On the other hand, if the control bias signal 112 indicates that the RF output is too high, perhaps where the output voltage from the converter 108 is higher than the power control signal 109, the power amplifier 104 may respond to the control bias signal 112 by decreasing its level of output.

It will be appreciated that the use of a closed loop or feedback loop for controlling the power amplifier 104 may improve the consistency of operation of the power amplifier 104. For example, the operation of the power amplifier 104 may be less sensitive to operational environment variations such as temperature, battery power voltage, and variations in implementation 1C process, according to an example embodiment of the invention.

In addition to using the power control signal (Vramp) 109 as part of the feedback loop for controlling an operation of the power amplifier 104, the power control signal 109 may also be utilized in an open loop for controlling an operation of the driver amplifier 102. As shown in FIGS. 1A, 1B, and 1C, the power control signal (Vramp) 109 may be utilized in an open-loop configuration for controlling the driver amplifier 102, according to an example embodiment of the invention. With an open-loop configuration, the power control signal (Vramp) 109 may be provided directly to the driver amplifier 102, or indirectly to the driver amplifier 104 via a transform circuit 114. In an example embodiment of the invention, the transform circuit 114 may include one or more active transistors. The transform circuit 104 may be operative to perform one or more of the following: (i) a linear function of gain or attention based upon on the driver amplifier's bias adjustment, (ii) a non-linear translation of the power control signal (Vramp) 109 (see, e.g., FIGS. 5 and 6), and (iii) level shift of the power control signal (Vramp) 109 to the driver amplifier 102 bias input. Indeed, the transform circuit 114 may be operative to change the slope of the received power control signal (Vramp) 109 and/or perform non-linear transformations on the received power control signal (Vramp) 109 in generating the control bias signal 116 (see, e.g., FIGS. 5 and 6).

In an example embodiment of the invention, the transform circuit 114 may be responsive to the received power control signal (Vramp) 109 to generate the control bias signal 116. As an example, the transform circuit 114 may receive a particular level of power control signal (Vramp) 109 and in turn, respond by producing a particular voltage or current for the control bias signal 116 that may be used for controlling an operation of the driver amplifier 102. For instance, for a zero or low level of the power control signal (Vramp) 109, the transform circuit 114 may generate a control bias signal 116 that results in a reduction or elimination of DC power consumption from the driver amplifier 102. Likewise, the transform circuit 114 may be operative to adjust the slope of the power control—that is, the rate at which the RF output 105 increases—by adjusting the control bias signal 116.

FIGS. 2A, 2B, and 2C illustrate another power amplifier control system 200, according to an example embodiment of the invention. FIGS. 2A-2C are similar to respective FIGS. 1A-1C, except that the driver amplifier 102 may be controlled by a closed loop or a feedback loop instead of an open loop. Accordingly, the systems 200, 220, 250 of FIGS. 2A-2C may include a driver amplifier 102 that is operative to receive an RF input 101 and generates an amplified input signal. The power amplifier 104 may be operative to receive the amplified input signal from the driver amplifier 102, which may be further amplified to generate an RF output 105. The operation of the power amplifier 104 may likewise be controlled by a closed loop or a feedback loop, which may comprise a monitoring block 103 and a comparator or error amplifier 110, as illustrated by FIG. 2A. As similarly described above, FIG. 2B illustrates that the monitoring block 103 of FIG. 2A may be comprised of a current sensing block 106 and a current to voltage converter 108. Alternatively, FIG. 2C illustrates that the monitoring block 103 of FIG. 2A may be comprised of a voltage sensing block 156 and a gain or attenuation block 158. It will be appreciated that other variations of the monitoring block 103 may likewise be available beyond those shown in FIGS. 2B and 2C.

In FIGS. 2A-2C, the systems 200, 220, and 250 may utilize a closed loop or feedback loop for the control of the driver amplifier 102. The use of a feedback loop may provide for an operation of the driver amplifier 102 that may be less sensitive to operational environment variations such as temperature, battery power voltage, and variations in implementation 1C process, according to an example embodiment of the invention. As shown in FIGS. 2A-2C, the feedback loop may comprise a comparator or error amplifier 202 and a converter or sensing block 204. A parameter associated with the operational condition of the driver amplifier 102 such as the DC current or DC bias, or alternatively a parameter associated with the amplified input signal generated by the driver amplifier 102, may be detected or otherwise received by the converter or sensing block 204. For example, the detected or received parameter may be a current or voltage associated with the DC current or DC bias. Alternatively, the detected or received parameter may be a power, current, and/or voltage associated with the amplified input signal generated by the driver amplifier 102. According to an example embodiment of the invention, the converter or sensing block 204 may be a voltage-to-voltage converter or a current-to-voltage converter. For example, the converter or sensing block 204 may be operative to scale a voltage associated with an operation of the driver amplifier 102. Alternatively, the converter or sensing block 204 may be operative to convert a current associated with an operation of the driver amplifier 102 to a voltage. The converter or sensing block 204 may comprise a resistor, according to an example embodiment of the invention. The output voltage from the converter or sensing block 204 may be provided as an input to the comparator or error amplifier 202.

The comparator or error amplifier 202 may additionally receive the power control signal (Vramp) 109. The comparator or error amplifier 202 may be operative to determine the extent to which the output voltage from the converter or sensing block 204 differs from the power control signal (Vramp) 109. Based upon this determination, the comparator or error amplifier 202 may generate a compensation signal. According to an example embodiment of the invention, the compensation signal may be the actual control bias signal 206 for operating or controlling an operation of the driver amplifier 102. On the other hand, the feedback loop may also include a transform circuit for converting the compensation signal into the control bias signal 206. In an example embodiment of the invention, the transform circuit may include one or more active transistors. According to an example embodiment of the invention, the control bias signal 206 may be provided as a voltage control bias signal or a current control bias signal. The control bias signal 206 may be used for adjusting a level of operation and/or gain of the driver amplifier 102.

As an example, for a zero or low level of the power control signal (Vramp) 109, a control bias signal 206 may be provided that results in a reduction or elimination of DC power consumption from the driver amplifier 102 by reducing an operation level of the driver amplifier 102. Likewise, the control bias signal 116 may be may be provided to operate the driver amplifier 102 in such as way as to adjust the slope of the power control, according to an example embodiment of the invention.

It will be appreciated by one of ordinary skill in the art that many variations of the example embodiments of FIGS. 1A-1C and 2A-2C may be available. According to an alternative embodiment of the invention, two or more driver amplifier stages may also be available for control. As an example, FIGS. 3A and 3B illustrate example embodiments having two driver amplifier stages.

Turning now to FIG. 3A, the system 300 may resemble the system 100 of FIG. 1A. However, the system 300 may include an additional driver amplifier 302. Accordingly, driver amplifier 302 may operate as a first driver amplifier stage that amplifies the RF input 101 to generate a first amplified input signal. The driver amplifier 103 may amplify the first amplified input signal from the driver amplifier 302 to generate a second amplified input signal. The power amplifier 104 may be operated to further amplify the second amplified input signal from the driver amplifier 103 to generate the RF output 105. In FIG. 3A, an operation of the power amplifier 104 may be controlled by a closed loop comprising the monitoring block 103 and the comparator or error amplifier 110, as similarly described with respect to FIGS. 1A-1C. For example, the monitoring block 103 may be operative to detect a parameter associated with the RF output 105. In an example embodiment of the invention, the detected parameter may be a power, current, or voltage associated with the RF output 105 of the power amplifier 104. The detected parameter, or a variation thereof, from the monitoring block 103 may then be provided to the comparator or error amplifier 110. The comparator or error amplifier 110 may additionally receive a power control signal (Vramp) 109. The comparator or error amplifier 110 may be operative to determine an extent to which the output voltage from the converter 108 differs from the power control signal (Vramp) 109. Based upon the comparison, the comparator or error amplifier 110 may generate a compensation signal. In an example embodiment of the invention, the compensation signal may be an actual control bias signal 112 that may be provided to the power amplifier 104 for operating or controlling an operation of the power amplifier 104. However, it will be appreciated that the feedback loop may also include a transform circuit for converting the compensation signal into the control bias signal 112 as well.

Likewise, the power control signal (Vramp) 109 may be utilized in an open-loop configuration for controlling the driver amplifier 102, as similarly described with respect to FIGS. 1A-1C, according to an example embodiment of the invention.

As illustrated by FIGS. 1A-1C and 2A-2C, a power control signal (Vramp) may be used to controlling one or more driver amplifiers in addition to the power amplifier. The additional control over the driver amplifier may enhance control over the minimum output power and/or slope of output power for the power amplifier system. With an open-loop configuration, the power control signal (Vramp) 109 may be provided to a transform circuit 114, which responds by generating the control bias signal 116 for operating the driver amplifier 102.

Similarly, the driver amplifier 302 may likewise be controlled using an open-loop configuration. Indeed, a transform circuit 313 may similarly receive the power control signal (Vramp) 109. The transform circuit 313 may include one or more active transistors. The transform circuit 313 may be operative to perform one or more of the following: (i) a linear function of gain or attention based upon on the driver amplifier's bias adjustment, (ii) a non-linear translation of the power control signal (Vramp) 109 (see, e.g., FIG. 6), and (iii) level shift of the power control signal (Vramp) 109 to the driver amplifier 302 bias input. In an example embodiment of the invention, the transform circuit 114 may be responsive to the received power control signal (Vramp) 109 to generate the control bias signal 315. As an example, the transform circuit 313 may receive a particular level of power control signal (Vramp) 109 and in turn, respond by producing a particular voltage or current for the control bias signal 315 that may be used for controlling an operation of the driver amplifier 302.

It will be appreciated that in some embodiments of the invention, the transform circuit 313 may be substantially the same as the transform circuit 114. Further, in some embodiments of the invention, the same transform circuit may actually be used to control both of the driver amplifiers 302 and 102. However, in other example embodiments, the transform circuits 313 and 114 may be different. Indeed, the separate controls over the operations of the driver amplifiers 302 and 102 may allow for additional control over non-linear translations of the driver bias signals in response to the power control signal (Vramp) 109, according to an example embodiment of the invention.

Turning now to FIG. 3B, the system 350 may resemble the system 200 of FIG. 2A. However, the system 350 may include an additional driver amplifier 302. Accordingly, driver amplifier 302 may operate as a first driver amplifier stage that amplifies the RF input 101 to generate a first amplified input signal. The driver amplifier 103 may amplify the first amplified input signal from the driver amplifier 302 to generate a second amplified input signal. The power amplifier 104 may be operated to further amplify the second amplified input signal from the driver amplifier 103 to generate the RF output 105. In FIG. 3B, an operation of the power amplifier 104 may be controlled by a closed loop comprising the monitoring block 103 and the comparator or error amplifier 110, as similarly described above.

Still referring to FIG. 3B, the driver amplifier 102 may be controlled by a closed loop or a feedback loop, as similarly described with respect to FIGS. 2A-2C. For example, the feedback loop may comprise a comparator or error amplifier 202 and a converter or sensing block 204. A parameter associated with the operational condition of the driver amplifier 102 such as the DC current or DC bias, or alternatively a parameter associated with the amplified input signal generated by the driver amplifier 102, may be detected or otherwise received by the converter or sensing block 204. For example, the detected or received parameter may be a current or voltage associated with the DC current or DC bias. Alternatively, the detected or received parameter may be a power, current, and/or voltage associated with the amplified input signal generated by the driver amplifier 102. According to an example embodiment of the invention, the converter or sensing block 204 may be a voltage-to-voltage converter or a current-to-voltage converter. The output voltage from the converter or sensing block 204 may be provided as an input to the comparator or error amplifier 202.

The comparator or error amplifier 202 may additionally receive the power control signal (Vramp) 109. The comparator or error amplifier 202 may be operative to determine the extent to which the output voltage from the converter or sensing block 204 differs from the power control signal (Vramp) 109. Based upon this determination, the comparator or error amplifier 110 may generate a compensation signal. According to an example embodiment of the invention, the compensation signal may be the actual control bias signal 206 for operating or controlling an operation of the driver amplifier 102. On the other hand, the feedback loop may also include a transform circuit for converting the compensation signal into the control bias signal 206. The control bias signal 206 may be used for adjusting a level of operation and/or gain of the driver amplifier 102.

Similarly, the driver amplifier 302 may be controlled by a closed loop or a feedback loop comprising a comparator or error amplifier 351 and a converter or sensing block 353. A parameter associated with the operational condition of the driver amplifier 302 such as the DC current or DC bias, or alternatively a parameter associated with the amplified input signal generated by the driver amplifier 302, may be detected or otherwise received by the converter or sensing block 353. For example, the detected or received parameter may be a current or voltage associated with the DC current or DC bias. Alternatively, the detected or received parameter may be a power, current, and/or voltage associated with the amplified input signal generated by the driver amplifier 302. According to an example embodiment of the invention, the converter or sensing block 353 may be a voltage-to-voltage converter or a current-to-voltage converter. The output voltage from the converter or sensing block 353 may be provided as an input to the comparator or error amplifier 351.

The comparator or error amplifier 351 may additionally receive the power control signal (Vramp) 109. The comparator or error amplifier 351 may be operative to determine the extent to which the output voltage from the converter or sensing block 353 differs from the power control signal (Vramp) 109. Based upon this determination, the comparator or error amplifier 351 may generate a compensation signal. According to an example embodiment of the invention, the compensation signal may be the actual control bias signal 355 for operating or controlling an operation of the driver amplifier 351. On the other hand, the feedback loop may also include a transform circuit for converting the compensation signal into the control bias signal 355. The control bias signal 355 may be used for adjusting a level of operation and/or gain of the driver amplifier 351.

It will be appreciated that the separate controls over the operations of the driver amplifiers 302 and 102, and yet other additional driver amplifiers, may allow for additional control over non-linear translations of the driver bias signals in response to the power control signal (Vramp) 109. According to an example embodiment of the invention, there may be two or multiple driver amplifier stages required or desired to provide for non-linear driver bias adjustment as described with respect to FIG. 6., or to otherwise provide for driver amplifier gain adjustment to cover various input power operations.

It will also be appreciated that variations of FIGS. 3A and 3B are available according to example embodiments of the invention. According to an example embodiment of the invention, one of the driver amplifiers 302 and 102 may be controlled using an open-loop configuration while the other driver amplifier 302 or 102 may be controlled using a closed-loop configuration. According to another example embodiment of the invention, there may be more than two driver amplifier stages. For example, there may be three, four, five, or more driver amplifiers in a cascade configuration, according to an example embodiment of the invention.

FIG. 4 illustrates an example graph of an operation of a power amplifier system that utilizes current-sensing, closed-loop control over the power amplifier, but with constant operation of the driver amplifier. In FIG. 4, the power amplifier (PA) output current 402 may be linearly proportional to the power control signal (Vramp) 408. However, that the relationship may not necessarily be linearly proportional where non-linear components may be present in the power amplifier or the feedback loop for controlling the power amplifier. Still referring to FIG. 4, the output power 404 fails to meet the required minimum power 409 at zero or low-level range of the power control signal (Vramp) 408. In particular, the constant operation of the driver amplifier maintains the input strength of the power amplifier to maintain its switching operation. Accordingly, the constant DC power consumption of driver amplifier degrades the power-added efficiency (PAE), which may be defined as PAE=100*(Pout_rf−Pin_rf)/DCpower, where Pout_rf may be the RF output power, Pin_rf may be the RF input power. In particular, the constant power consumption of the driver amplifier decreases power-added efficiency rapidly at a low power operation of when the power control signal (Vramp) 408 is near zero or low level. Furthermore, the slope of the output power 404 relative to the power control signal (Vramp) 408 may be beyond allowable specification during low-power operation.

FIG. 5 illustrates an example graph of an operation of a power amplifier system that utilizes control over both the power amplifier and driver amplifier, according to an example embodiment of the invention. In FIG. 5, the output power 504 may reach the minimum required power 509 with the assistance of the driver amplifier bias signal 506. In particular, at a zero or low-level of the power control signal (Vramp) 508, the driver amplifier bias signal 506 may be reduced, thereby reducing an operation level of the driver amplifier, in order to minimize or prevent leakage current or power from being provided from the driver amplifier to the power amplifier. According to an example embodiment of the invention, the illustrated driver amplifier bias signal 506 response to the power control signal (Vramp) 508 may be provide by the respective open-loop (e.g., control bias signal 112) or closed-loop controls (e.g., control bias signal 506) of the driver amplifier, as illustrated respectively in FIGS. 1 and 2. According to an example embodiment of the invention, the open-loop or closed-loop controls may be operative to vary the driver amplifier bias signal 506 at a lower range of the power control signal (Vramp) 508. On the other hand, the open-loop or closed-loop controls may be operative to hold the driver amplifier basis signal 506 signal substantially constant at a higher range of the power control signal (Vramp). It will be appreciated that the example graph in FIG. 5 may be applicable for current-controlled closed loops for the power amplifier. However, for voltage-controlled closed loops, the example graph of FIG. 5 may still be representative, except the line denoted as the PA current 502 may instead reflect the PA voltage.

FIG. 6 illustrates another example graph of an operation of a power amplifier system that utilizes control over both the power amplifier and driver amplifier, according to an example embodiment of the invention. In FIG. 6, the driver amplifier bias signal 606 may be manipulated to adjust the slope S1 for the output power 604 in FIG. 6 to an allowable power control scope specification. The illustrated driver amplifier bias signal 606 response to the power control signal (Vramp) 608 may be provide by the respective open-loop (e.g., control bias signal 112) or closed-loop controls (e.g., control bias signal 606) of the driver amplifier, as illustrated respectively in FIGS. 1 and 2. The non-linear translation of the driver amplifier bias signal 606 may be achieved by either non-linear transformation provided by one or more transform circuits and/or manipulation of one or more multiple driver stages bias controls, according to an example embodiment of the invention. As similarly described herein, the open-loop or closed-loop controls may be operative to vary the driver amplifier bias signal 606 at a lower range of the power control signal (Vramp) 608. On the other hand, the open-loop or closed-loop controls may be operative to hold the driver amplifier basis signal 606 signal substantially constant at a higher range of the power control signal (Vramp) 608. It will be appreciated that the example graph in FIG. 6 may be applicable for current-controlled closed loops for the power amplifier. However, for voltage-controlled closed loops, the example graph of FIG. 6 may still be representative, except the line denoted as the PA current 602 may instead reflect the PA voltage.

It will be appreciated that FIGS. 5 and 6 illustrate only example embodiments of how the driver amplifier bias control signals may be adjusted in accordance with the open-loop and/or closed-loop controls described herein. One of ordinary skill in the art will recognize that different driver amplifier bias control signals may be utilized depending on specifications of the driver amplifier, power amplifier, and associated transmitter system components.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A power-amplifier system, comprising:
 a driver amplifier that is operative to receive an input signal and generate an amplified input signal;
 a circuit for receiving a power control signal and generating a first control bias signal for adjusting an operation of the driver amplifier;
 a power amplifier that is operative to receive the amplified input signal and generate an output signal; and
 a feedback loop that receives the power control signal and generates a second control bias signal for adjusting an operation of the power amplifier, wherein the feedback loop comprises:
  a sensing block that detects a parameter associated with the output signal of the power amplifier, and
  a comparator that compares the detected parameter or a variation of the detected parameter to the received power control signal, wherein based upon the comparison, the comparator generates a compensation signal associated with the second control bias signal, wherein the sensing block comprises a current sensing block for detecting current associated with the output signal, wherein the detected current is converted to a detected voltage, and wherein the comparator compares the detected voltage to the power control signal in generating the compensation signal associated with the second control bias signal.

2. The power-amplifier system of claim 1, wherein the feedback loop is a first feedback loop, wherein the sensing block is a first sensing block, wherein the comparator is a first comparator, and wherein the circuit is a second feedback loop comprising:
 a second converter or sensing block for detecting a second parameter associated with an operational condition of the driver amplifier; and
 a second comparator that compares the detected second parameter to the power control signal, wherein based upon the comparison, the second comparator generates a second compensation signal associated with the first control bias signal.

3. The power-amplifier system of claim 2, wherein the second parameter is a DC bias current or DC bias associated with the driver amplifier.

4. The power-amplifier system of claim 2, wherein the second converter or sensing block is a voltage-to-voltage converter or a current-to-voltage converter.

5. The power-amplifier system of claim 1, wherein the circuit is an open loop comprising a transform circuit that receives the power control signal and generates the first control bias signal.

6. The power-amplifier system of claim 1, wherein the detected parameter is one of power, current, or voltage associated with the output signal of the power amplifier.

7. The power amplifier power-amplifier system of claim 1, wherein the current sensing block comprises a sensing resistor.

8. The power-amplifier system of claim 1, wherein the driver amplifier is a second driver amplifier, wherein the input signal is a second input signal, wherein the amplified input signal is a second amplified input signal, wherein the circuit is a second circuit, and further comprising:
a first driver amplifier that is operative to receive a first input signal and generate a first amplified input signal, wherein the first amplified input signal is received by the second driver amplifier as the second input signal; and
a first circuit for receiving the power control signal and generating a second bias control signal for adjusting an operation of the first driver amplifier.

9. The power-amplifier system of claim 1, wherein the comparator is an error amplifier.

10. The power-amplifier system of claim 1, wherein the compensation signal is the second control bias signal.

11. The power-amplifier system of claim 1, wherein the feedback loop further comprises a transform circuit that receives the compensation signal and generates the second control bias signal.

12. A power-amplifier system, comprising:
a driver amplifier that amplifies a radio frequency (RF) input to generate an amplified input signal, wherein a first control of the driver amplifier is responsive to a power control signal in delivering a first bias signal to the driver amplifier; and
a power amplifier that amplifies the amplified input signal to generate a RF output, wherein a second control of the power amplifier is responsive to the power control signal and a detected parameter associated with the RF output in delivering a second bias signal to the power amplifier, wherein the first control is operative to vary the first bias signal at a lower range of the power control signal, and wherein the first control is operative to hold the first bias signal substantially constant at a higher range of the power control signal.

13. The power-amplifier system of claim 12, wherein the first control is operative to reduce power consumption of the driver amplifier to the power amplifier by reducing a level of the first bias signal.

14. The power-amplifier system of claim 12, wherein the second control comprises a feedback loop that includes a current sensor, a converter, and an error amplifier, wherein the current sensor detects a current associated with the RF output, wherein the converter converts the detected current to a detected voltage, and wherein the error amplifier compares the detected voltage to the power control signal to generate the second bias signal or a compensation signal associated with the second bias signal.

15. The power-amplifier system of claim 12, wherein the first control is an open-loop control, wherein the open-loop control includes a transform circuit for receiving the power control signal and generating the first bias signal.

16. The power-amplifier system of claim 12, wherein the second control comprises a feedback loop that includes a converter or sensor and an error amplifier, wherein the current converter or sensor detects a parameter associated with an operational condition of the driver amplifier, and wherein the error amplifier compares the detected parameter to the power control signal to generate the first bias signal or a compensation signal associated with the first bias signal.

17. The power amplifier system of claim 12, wherein the first control is operative to vary a control slope associated with the RF output.

18. A power-amplifier system, comprising:
a driver amplifier that is operative to receive an input signal and generate an amplified input signal;
a circuit for receiving a power control signal and generating a first control bias signal for adjusting an operation of the driver amplifier;
a power amplifier that is operative to receive the amplified input signal and generate an output signal; and
a feedback loop that receives the power control signal and generates a second control bias signal for adjusting an operation of the power amplifier, wherein the feedback loop comprises:
a sensing block that detects a parameter associated with the output signal of the power amplifier, and
a comparator that compares the detected parameter or a variation of the detected parameter to the received power control signal, wherein based upon the comparison, the comparator generates a compensation signal associated with the second control bias signal, wherein the sensing block comprises a voltage sensing block for detecting a voltage associated with the output signal, and wherein the comparator compares the detected voltage or a scaled version of the detected voltage to the power control signal in generating the compensation signal associated with the second control bias signal.

19. The power-amplifier system of claim 18, wherein the feedback loop is a first feedback loop, wherein the sensing block is a first sensing block, wherein the comparator is a first comparator, and wherein the circuit is a second feedback loop comprising:
a second converter or sensing block for detecting a second parameter associated with an operational condition of the driver amplifier; and
a second comparator that compares the detected second parameter to the power control signal, wherein based upon the comparison, the second comparator generates a second compensation signal associated with the first control bias signal.

20. The power-amplifier system of claim 18, wherein the circuit is an open loop comprising a transform circuit that receives the power control signal and generates the first control bias signal.

21. The power-amplifier system of claim 18, wherein the detected parameter is one of power, current, or voltage associated with the output signal of the power amplifier.

22. The power-amplifier system of claim 18, wherein the driver amplifier is a second driver amplifier, wherein the input signal is a second input signal, wherein the amplified input signal is a second amplified input signal, wherein the circuit is a second circuit, and further comprising:
a first driver amplifier that is operative to receive a first input signal and generate a first amplified input signal, wherein the first amplified input signal is received by the second driver amplifier as the second input signal; and a first circuit for receiving the power control signal and generating a second bias control signal for adjusting an operation of the first driver amplifier.

23. The power-amplifier system of claim 18, wherein the compensation signal is the second control bias signal.

24. The power-amplifier system of claim 18, wherein the feedback loop further comprises a transform circuit that receives the compensation signal and generates the second control bias signal.

* * * * *